(12) United States Patent
Zhou

(10) Patent No.: US 6,389,438 B1
(45) Date of Patent: May 14, 2002

(54) MATCHED FILTER AND SIGNAL RECEPTION APPARATUS

(75) Inventor: Changming Zhou, Tokyo (JP)

(73) Assignee: Yozan Inc., Tokyo (JP)

( * ) Notice: Subject to any disclaimer, the term of this patent is extended or adjusted under 35 U.S.C. 154(b) by 0 days.

(21) Appl. No.: 09/256,351

(22) Filed: Feb. 24, 1999

(30) Foreign Application Priority Data

Feb. 25, 1998 (JP) ............................................ 10-060569
Sep. 18, 1998 (JP) ............................................ 10-264759

(51) Int. Cl.[7] ................................................ G06J 1/00
(52) U.S. Cl. ........................................................ 708/3
(58) Field of Search ..................... 708/3, 319; 370/342; 375/343

(56) References Cited

U.S. PATENT DOCUMENTS 5,930,290 A * 7/1999 Zhou et al. .................. 370/342
6,064,690 A * 5/2000 Zhou et al. .................. 370/342
6,169,771 B1 * 1/2001 Shou et al. .................. 375/343

FOREIGN PATENT DOCUMENTS

| JP | 8-84162 | 3/1996 |
| JP | 10-247955 | 9/1998 |
| JP | 11-168515 | 6/1999 |

\* cited by examiner

Primary Examiner—Tan V. Mai
(74) Attorney, Agent, or Firm—Pillsbury Winthrop LLP

(57) ABSTRACT

A matched filter and signal reception apparatus having a low power consumption and small circuitry size. In the matched filter, an analog input signal is converted to digital data by an analog to digital (A/D) converter, digital multiplication, as a correlation calculation, is executed by a plurality of exclusive-OR circuits, and an addition of outputs of the exclusive-OR circuits is performed. In the digital multiplication, the digital data is multiplied by a spreading code of one bit. The outputs from the exclusive-OR circuits are added for each weight of bits, and the addition output results are weighted and summed together.

20 Claims, 17 Drawing Sheets

| X1 | X2 | Out |
|----|----|-----|
| 1 | 1 | VH |
| 1 | 0 | Vref |
| 0 | 1 | Vref |
| 0 | 0 | VL |

MATCHED FILTER AND SIGNAL RECEPTION APPARATUS

DETAILED DESCRIPTION OF THE INVENTION

Background of the Invention

1. Field of the Invention

The present invention relates to a matched filter and signal reception apparatus. More particularly, the present application relates to a matched filter and a signal reception apparatus preferable for a DS-CDMA cellular system.

2. Description of Related Art

Direct sequence code division multiple access (DSCDMA) cellular systems have attracted more attention as the number of users of the land mobile communication have increased, based upon the large capacity of the DS-CDMA system. In the DS-CDMA system, at a transmitter side, transmission data is modulated and then spreaded by a PN-code. At a receiver side, the received signal is despread by the PN-code so that the transmission data is reproduced. A sliding correlator or a matched filter is used for the despreading. The sliding correlator is small in circuit size but requires a long time for the correlation calculation. While, the matched filter is fast in correlation calculation but is rather big in circuit size.

A conventional matched filter consists of a charge coupled device (CCD), a surface acoustic wave (SAW) device, or a digital circuit. A matched filter is proposed in Patent Publication Hei06-164320 by the inventors of the present invention, and consists of an analog circuit and is of high speed as well as low power consumption. The matched filter includes a sampling and holding circuit for holding a plurality of input analog signals as discrete data, a plurality of multiplication circuits for multiplying the analog signals by multipliers that are shifted and circulated, and an adder for summing the multiplied data.

However, the proposed matched filter has a problem with large circuit size because of the many analog sampling and holding circuits and peripheral circuits such as refreshing circuit.

SUMMARY OF THE INVENTION

The present invention provides a matched filter and a signal reception apparatus having a low power consumption and small circuit size.

In the present invention, a matched filter comprises an analog to digital converter for converting analog signals into digital data, a data holding means having a plurality of stages for holding said digital data, a multiplier supplying means for supplying a spreading code, a plurality of exclusive-OR circuits corresponding to the plurality of stages, each of which calculates an exclusive-OR of one of the digital data and one of said 1 bit data, and an adder for summing said exclusive-ORs.

In a matched filter according to the present invention, analog input data is converted to digital data by an analog to digital (A/D) converter and exclusive-OR of the digital data and PN-code is calculated.

In another embodiment of the matched filter of the present invention, analog input data is converted to digital data by an A/D converter and exclusive-OR of the digital data and PN-code is calculated, then the exclusive-or output is summed by an analog adder.

DETAILED DESCRIPTION

Hereinafter, preferred embodiments of the signal reception apparatus for DS-CDMA cellular system and matched filter therefor are described with reference to the attached drawings.

Figure 1:
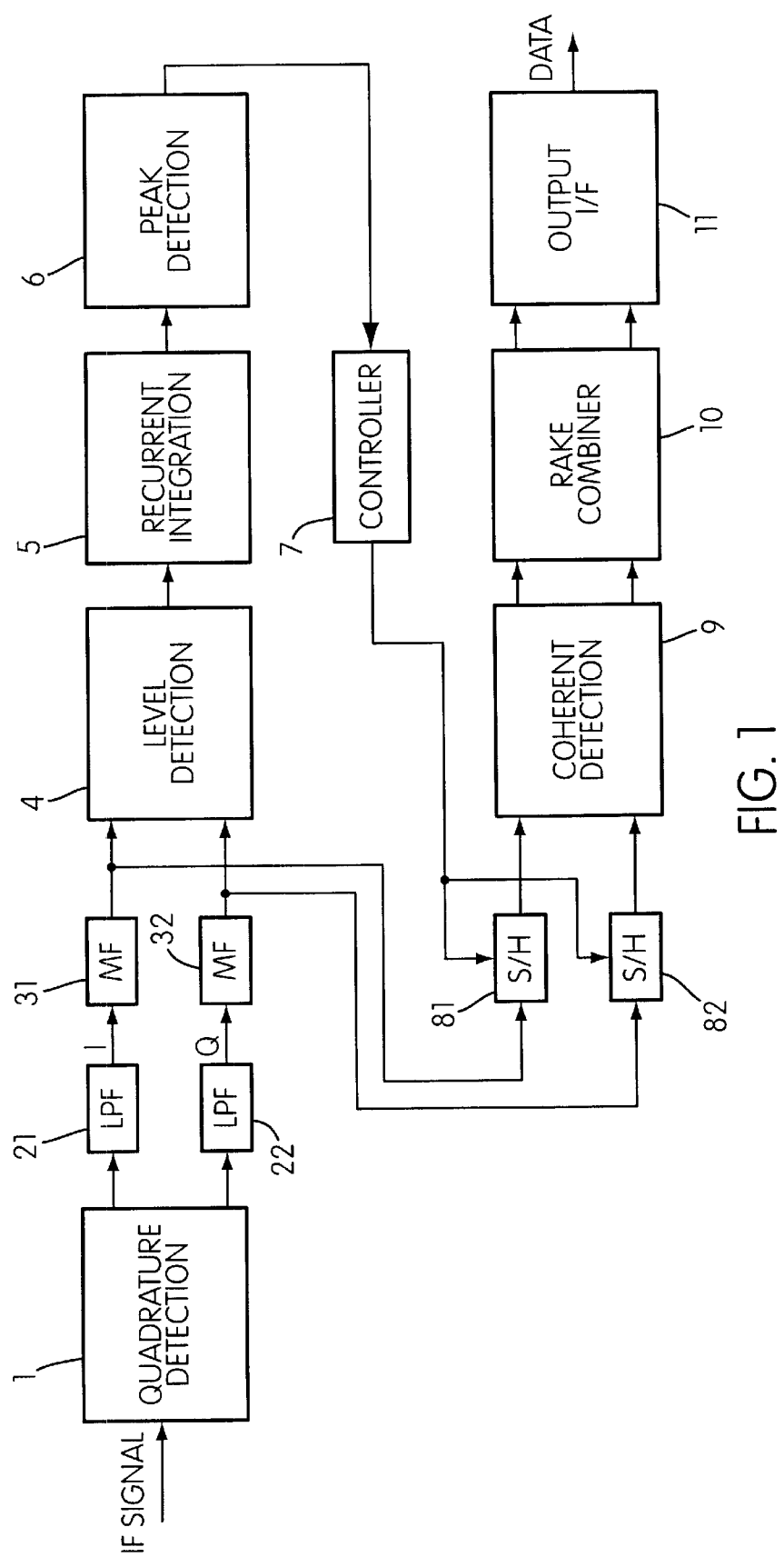
FIG. 1 is a block diagram showing an embodiment of a signal reception apparatus for DS-CDMA cellular system using a matched filter according to the present invention.

FIG. 1 is a block diagram showing a main portion of a signal reception apparatus for a DS-CDMA cellular system.

In FIG. 1, a quadrature detector 1 for separating an intermediate frequency (IF) signal into I- and Q-components by quadrature detection is illustrated. Matched filters 31 and 32 despread the I- and Q-components, respectively, passed through low-pass filters 21 and 22, respectively. Despread outputs from the matched filters 31 and 32 are input to sampling and holding circuits 81 and 82, and to a level detection circuit 4.

The level detection circuit 4 calculates a signal power of outputs from the matched filters 31 and 32, and converts the signal power in a digital data output. The output of the level detection circuit 4 is integrated for a plurality of symbol periods by a recurrent integration circuit 5 in order to reduce for example, the influences of noise etc. The output of the recurrent integration circuit 5 is input to a peak detection circuit 6 which detects peaks higher than a predetermined threshold. The output of the peak detection circuit 6 is input to a controller 7 which determines the timing of sampling and holding of the sampling and holding circuits 81 and 82, synchronous to the position (phase) of the peaks detected by the peak detection circuit 6. Thus, the I- and Q-components of the despread output corresponding to peaks higher than the predetermined threshold are input to the sampling and holding circuits 81 and 82, respectively. The sampling and holding circuits 81 and 82 sample and hold the despread outputs from the matched filters 31 and 32 corresponding to the selected correlation peaks discussed above. Outputs from the sampling and holding circuits 81 and 82 are detected by a coherent detection circuit 9, and are input to a rake combiner 10 which shifts the outputs in phase for synchronization and then combines the outputs. Output from the rake combiner 10 are input to an output interface (I/F) that generates demodulated data (Data).

Figure 2:
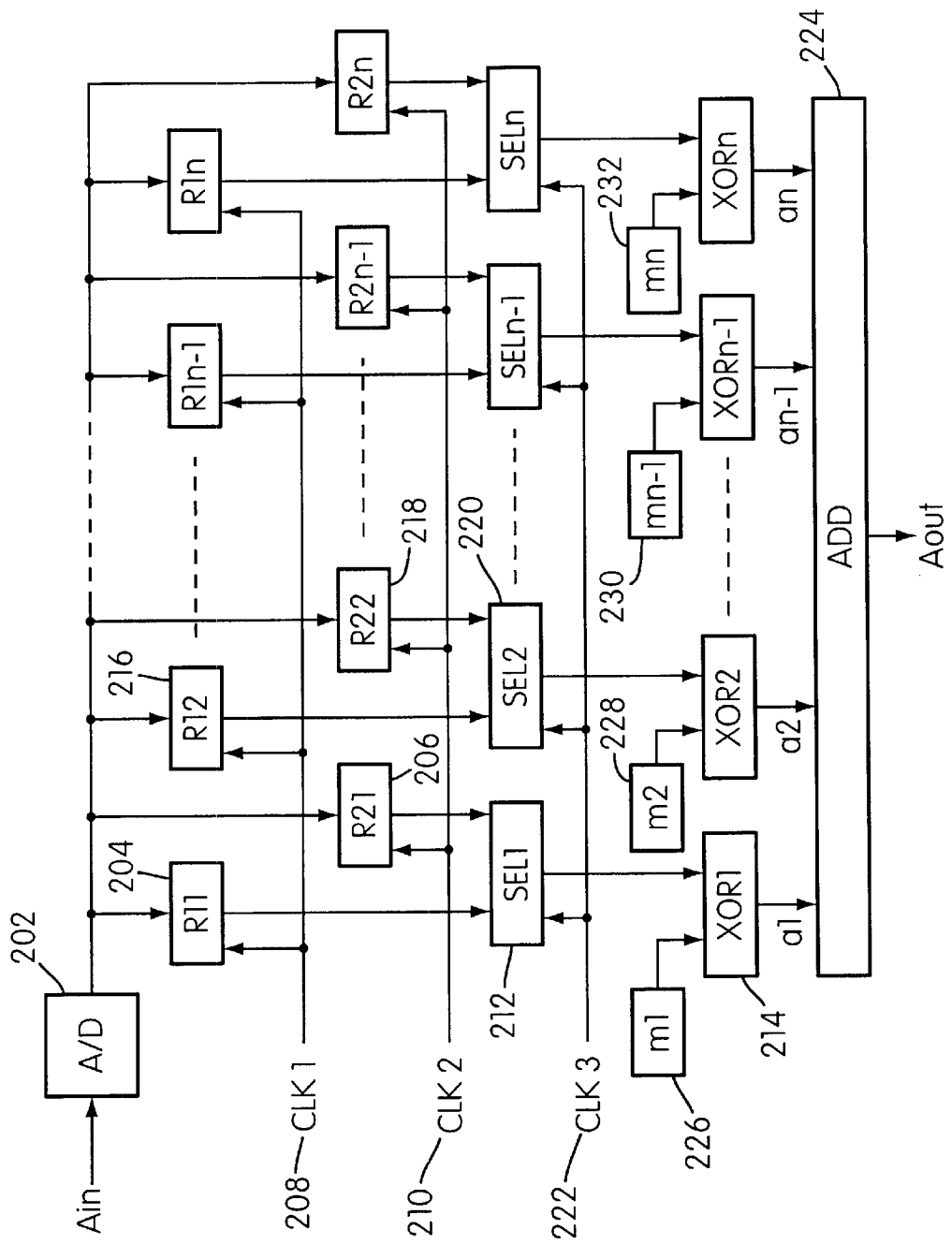
FIG. 2 is a block diagram showing a first embodiment of a matched filter according to the present invention.

FIG. 2 is a block diagram showing an embodiment of the matched filters 31 and 32. The matched filters MF include an analog to digital converter (A/D) 202 which receives an analog input signal Ain, one of I- and Q-components, output of which is input to a series of data registers 204 R11 to R1n and to a series of data registers 206 R21 to R2n. The series of data registers 204 R11 to R1n are controlled by a clock CLK1 208 so that one of the resisters 204 R11 to R1n successively receives the output of the A/D converter 202. The series of data registers 206 R21 to R2n are controlled by a clock CLK2 210, of the same frequency as CLK1 208 but shifted from CLK1 208 by a half period, so that one of the registers 206 R21 to R2n successively receives the output of the A/D converter 202.

A series of selectors 212 SEL1 to SELn and a series of exclusive-or circuits 214 XOR1 to XORn are provided corresponding to the data registers 204 R11 to R1n and 206 R21 to R2n. The outputs of the data registers 204 R11 and 206 R21 are input to the corresponding selector 212 SEL1, the outputs of the data registers 216 R12 and 218 R22 are input to the corresponding selector SEL2 220, and similarly, the outputs of the data registers R1n and R2n are input to the corresponding selector SELn. The selectors SEL1 to SELn are controlled by a clock CLK3 222 so that each of the selectors 212 SEL1 to SELn alternatively outputs one of the outputs from the series 204 R11 to R1n and from the series 206 R21 to R2n. The clock CLK3 222 is synchronous to the clock CLK1 208 or CLK2 210. When CLK3 222 is high, the data of the series 204 R11 to R1n are selected, and when CLK3 222 is low, the data of the series 206 R21 to R2n are selected. Each of the outputs of the selectors SEL1 to SELn includes a plurality of bits (least significant bit (LSB) to most significant bit (MSB)) and is input to the corresponding exclusive-OR circuit 214 of XOR1 to XORn.

A series of multiplier supplying means for supplying spreading codes, such as $m_1$ 226 to $m_n$ 232, are input to inputs of the exclusive-OR circuits 214 XOR1 to XORn respectively, and another input of each of the exclusive-OR circuits of XOR1 to XORn is corresponding to each output of the outputs of SEL1 to SELn. Each of the exclusive-OR circuits performs a logical calculation using the output of the corresponding selector among SEL1 to SELn and corresponding bits of the spreading code. When the bit of the spreading code is "1", the digital bits corresponding to the analog input are inverted, and when the spreading code is "0", the analog input is not inverted. This is equivalent to a multiplication by the spreading code. The spreading codes $m_1$ to $m_n$ are shifted and circulated in response to the clock CLK1 208, and are input to the exclusive-OR circuits 214 XOR1 to XORn.

Outputs a1 to an of the exclusive-OR circuits 214 $XOR_1$ to $XOR_n$ are input to an adder such as ADD 224 for outputting a total summation Aout of the outputs a1 to an. The outputs of the exclusive-OR circuits 214 $XOR_1$ to $XOR_n$ are digital data, and the adder ADD 224 converts the digital data into analog data so as to generate analog data Aout as an addition result.

Since the circuit above performs the digital multiplication, the circuit size and electrical power consumption are reduced as compared with the conventional full analog circuit. The calculation speed of the present embodiment is fast and accuracy is high, because the multiplication outputs are summed by the adder ADD 224.

The clocks CLK1 208 and CLK2 210 shifting by a half period from each other enable a "double sampling". When the double sampling is unnecessary, only one of the series of the data registers 204 R11 to R1n and R21 to R2n 210 is provided and the selectors 212 SEL1 to SELn are omitted. Furthermore, more than two series of data registers may be provided for higher sampling rate.

Figure 3:
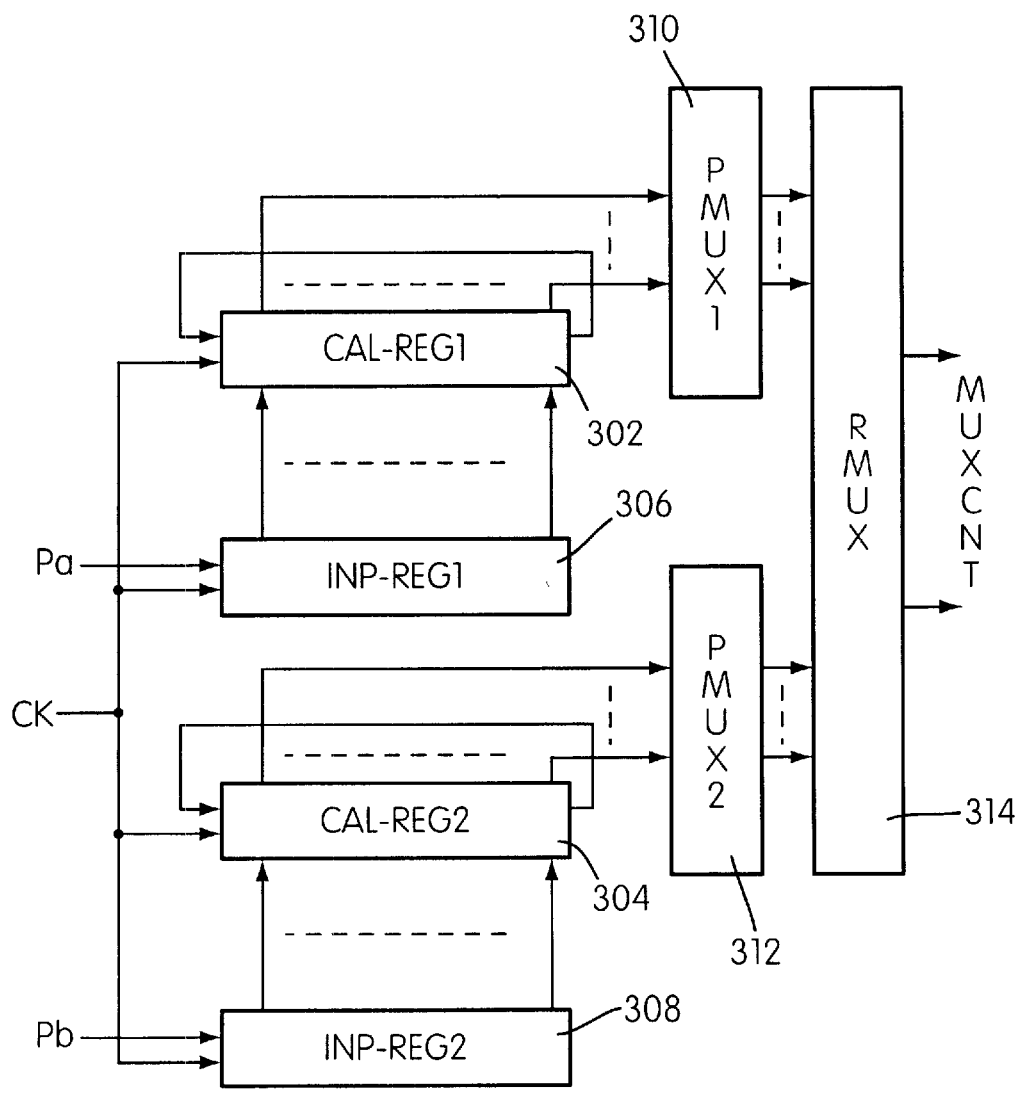
FIG. 3 is a block diagram showing a plurality of registers of PN codes in FIG. 2.

FIG. 3 is a block diagram showing a plurality of registers for supplying the PN code m1 to mn (multipliers) to the exclusive-OR circuits 214 XOR1 to XORn in FIG. 2. There are two systems for supplying the PN code, a first system from a calculation register CAL-REG1 302 and a second system from a calculation register CAL-REG2 304. Input registers INP-REG1 306 and INP-REG2 308 are connected to the calculation registers CAL-REG1 302 and CALREG2, 304 respectively. Different spreading codes Pa and Pb are input to input registers INP-REG1 306 and INP-REG2 308, respectively, and are transferred to the calculation registers CAL-REG1 302 and CAL-REG2 304, respectively. The last stages of the calculation registers CAL-REG1 and CAL-REG2 are connected to their first stages, respectively, so that the PN codes are circulated in response to a clock CK. The clock CK is synchronous to the timing that the data registers receive the outputs from the A/D converter 202. The CLK1 is used as CK, usually.

The data in the calculation registers CAL-REG1 302 and CAL-REG2 304 are input to phase multiplexers PMUX1 310 and PMUX2 312, respectively. The phase multiplexers output data in the CAL-REG1 302 and CAL-REG2 304, respectively, as they are, or of backwardly shifted state by one chip time. The outputs of the phase multiplexers PMUX1 310 and PMUX2 312 are input to a register multiplexer RMUX 314 for alternatively outputting the outputs of CAL-REG1 302 and CAL-REG2 304 as MUX-CNT. MUXCNT is input to XOR1 to XORn as the multipliers m1 to mn. By switching the register multiplexer RMUX, the correlation calculations by PN code in CAL-REG1 302 and CAL-REG2 are performed in a time sharing manner.

As mentioned above, reception of long delay path more than one symbol period, of multi-code, and signal reception for soft hand-over are realized by a small circuit.

When the same spreading codes are input to the INP-REG1 306 and INP-REG2 308 of different phases from each other by a predetermined phase, a path delayed by more than one symbol period can be despread. When different spreading codes are input to the INP-REG1 306 and INP-REG2 308, signal reception for mufti-code and for soft hand-over is possible.

There is a possibility that a plurality of correlation peaks by the PN codes stored in CAL-REG1 302 and CAL-REG2 304 occur simultaneously.

Figure 5:
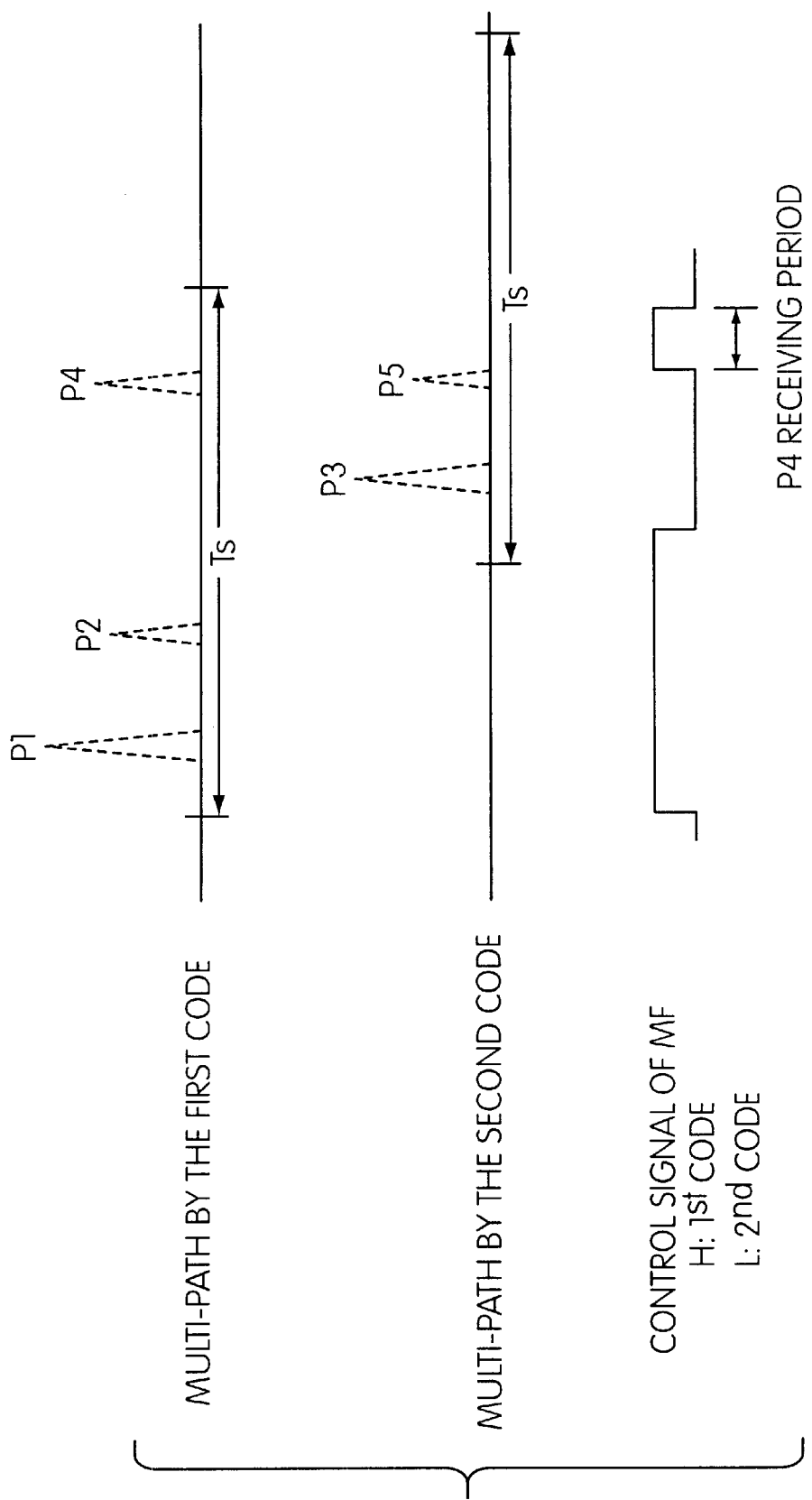
FIG. 5 is a diagram showing a signal wave having an overlap of correlation peaks.

As shown in FIG. 5, three correlation peaks P1, P2 and P4 occur by the first code in CAL-REG1 302 in a symbol period Ts. Two correlation peaks P3 and P5 occur by the second code in CAL-REG1 in a symbol period Ts. The peaks P4 and P5 occur simultaneously and will cause an overlapping of peaks. Since the phase multiplexers PMUX1 310 and PMUX2 312 output data in the CAL-REG1 302 and CAL-REG2 304, respectively, as they are, or of backwardly shifted state by one chip time as mentioned above, the overlapped peaks can be separated.

Figure 4:
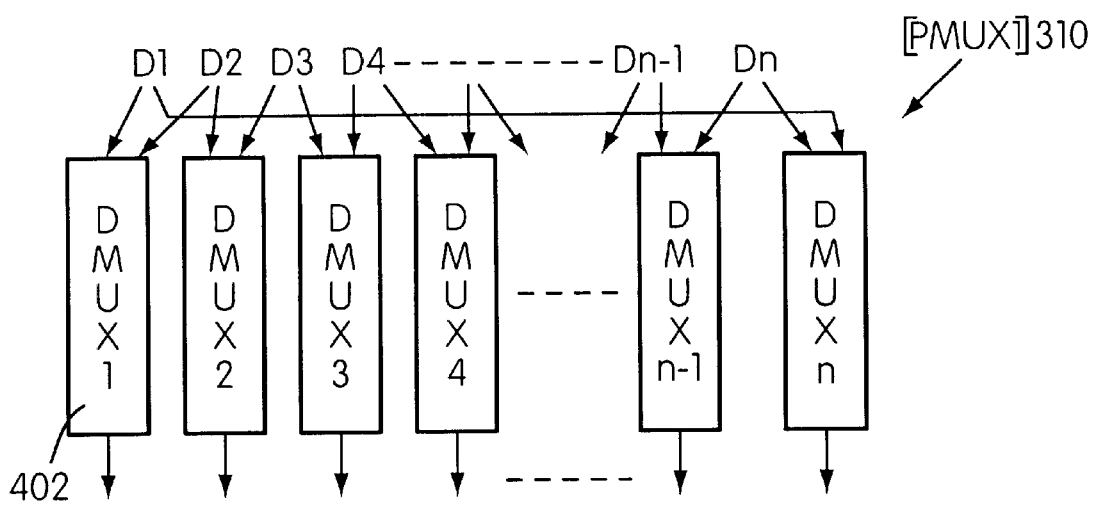
FIG. 4 is a block diagram showing a phase multiplexer in FIG. 3.

FIG. 4 is a block diagram showing a phase multiplexes PMUX1 310 in FIG. 3. The phase multiplexer PMUX1 310 includes a plurality of two-inputs-one-output data multiplexers 402 DMUX1 to DMUXn corresponding to data D1 and D2, D2 and D3, . . . , Dn−1 and Dn, and Dn and D1, respectively. By switching these data multiplexers synchronously, the data in the CAL-REG1 302 is output through the phase multiplexer PMUX1 310 as they are (current state) or backwardly shifted (one chip previous).

If no overlapping occurs, as the peaks P1, P2 and P3 in FIG. 4, the D1 to Dn in the CAL-REG1 302 are output as they are output. If the overlapping occur as the peaks P4 and P5 of FIG. 4, the correlation calculation by the spreading code in CAL-REG1 302 is performed once, and, one chip time later, correlation by the spreading code in CAL-REG2 304 is performed.

The control signal in FIG. 5 is input to RMUX 314 for alternatively selecting PMUX1 310 or PMUX2 312 in response to "1" and "0" of the control signal. In synchronism with the multi-paths P1 and P2, the control signal becomes high level "1" so that the RMUX 314 outputs the first code stored in the CAL-REG1 302. Then, the data multiplexers 402 DMUX1 to DMUXn output the data D1 to Dn as they are. Then, despread by the first code is performed.

The control signal becomes low level "0" for synchronizing with the peaks P3 and P5 so that the register multiplexes RMUX 314 is connected to the phase multiplexer PMUX2 312. The signal is despread by the second spreading code stored in the calculation register CAL-REG2 304. Since the peak P4 and P5 overlap each other, one chip time after the despread of the peak P5 by the second code, the control signal becomes high level so despreading by the first code. The same received signal must be processed by these despread, the data multiplexers 402 DMUX1 to DMUXn are switched so that the data backwardly shifted is generated.

The phase multiplexes PMUX2 312 is similar to PMUX1 310, so the description therefor is omitted.

Figure 6:
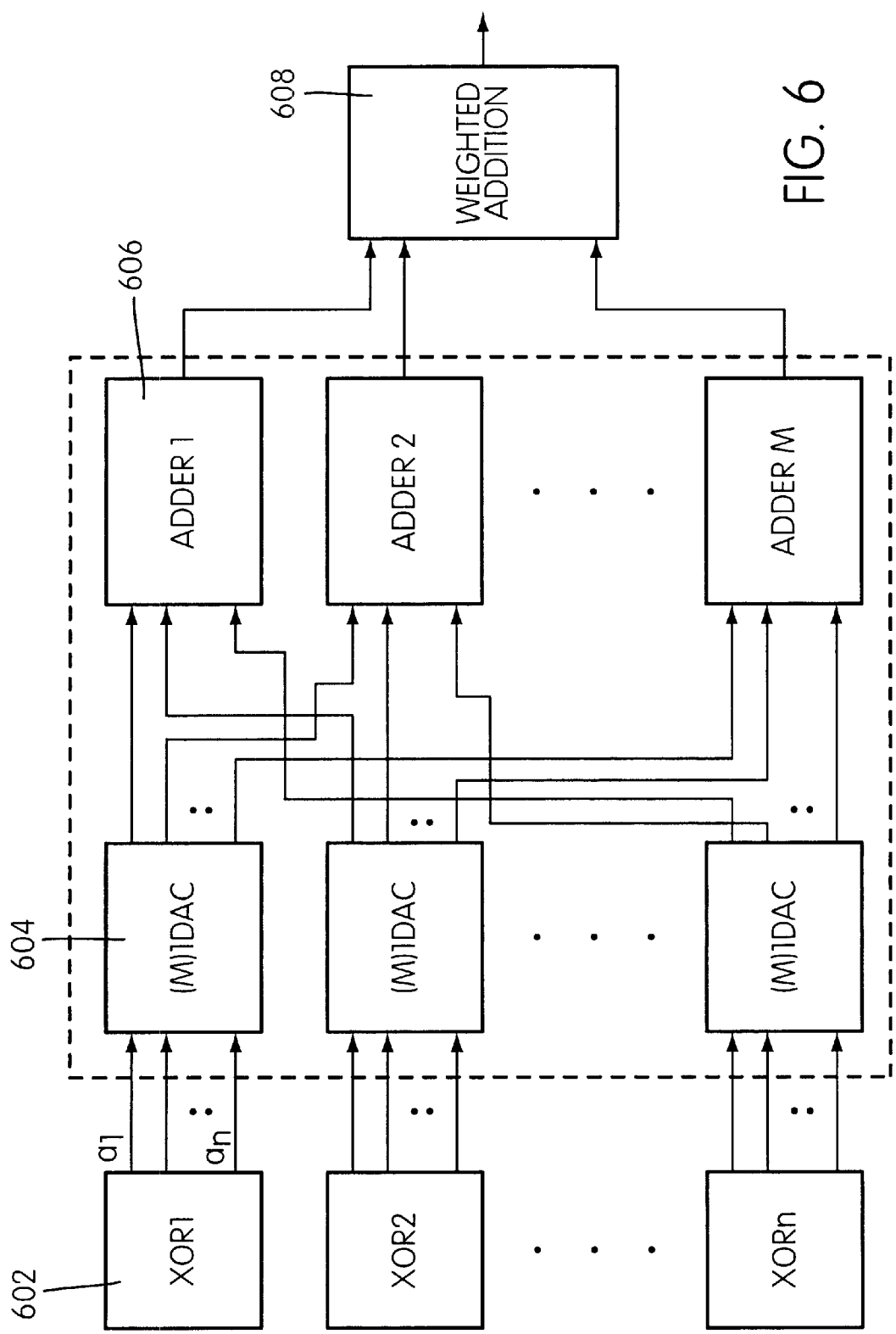
FIG. 6 is a block diagram showing an analog adder in the matched filter in FIG. 2.

If the data multiplexers are substituted by multiplexers of three-or-more-inputs-one multiplexes, data before a plurality of chip times can be reproduced. A plurality of peaks overlapping, or a plurality of continuous overlapping can be separated. FIG. 6 is a block diagram showing an adder in the matched filter of FIG. 2. The outputs $a_1$ to $a_n$ of the exclusive-OR circuits 602 XOR1 to XORn are respectively input, for example, to corresponding digital to analog (D/A) converters 604 (M)1DAC for converting the digital signals a1 to an into analog voltage signals. Here, the data a1 to an are "M" bits signals.

Figure 7:
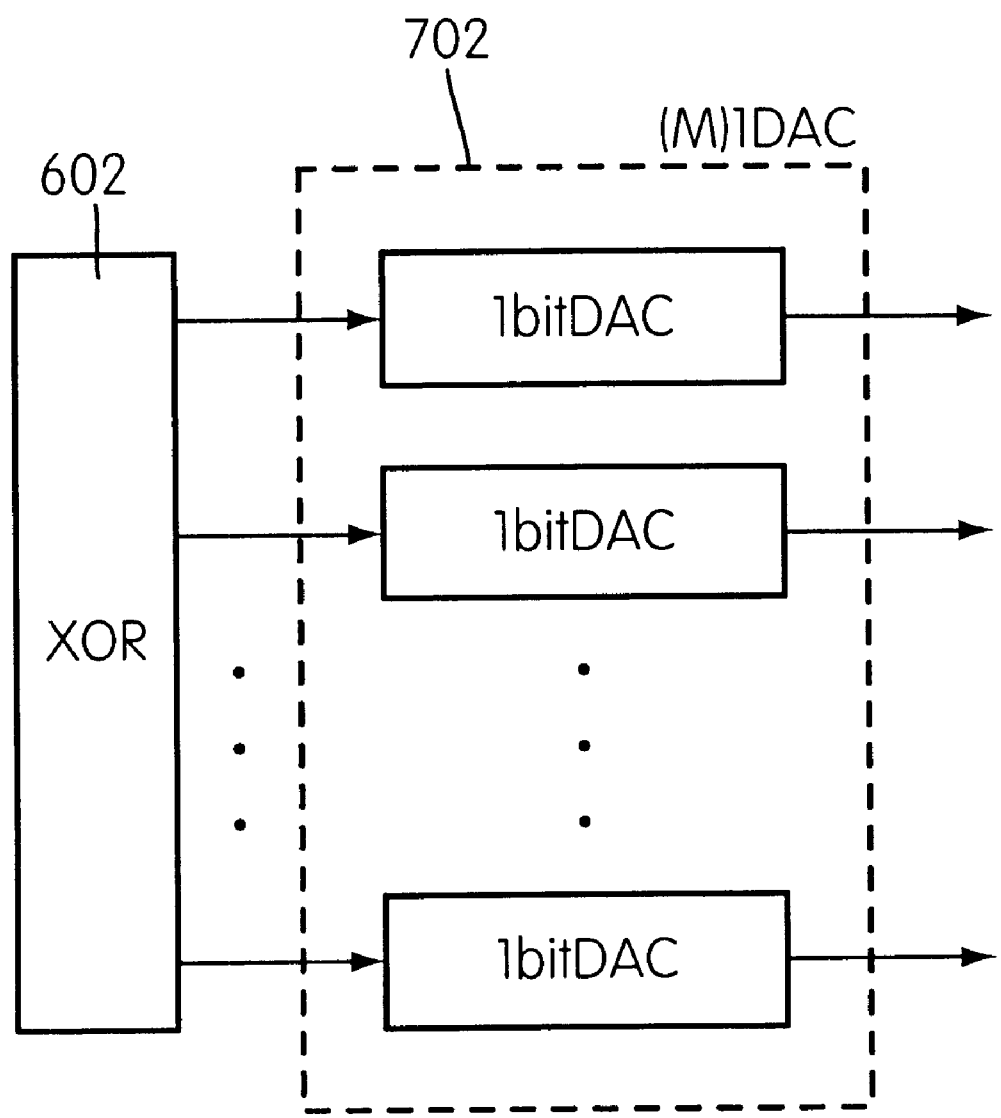
FIG. 7 is a block diagram showing a digital to analog converter of the analog adder in FIG. 6.

FIG. 7 is a block diagram showing the D/A converter 604 of the adder in FIG. 6, which includes a plurality of 1 bit D/A converters 702 1bitDAC of a number of "M". The analog signals corresponding to the digital signals of XOR1 to XORn are input to the corresponding adders 606 Adder1 to AdderM. Each of the digital bits of outputs of the Adder1 to AdderM are added to other digital bits of the same bits, weighted by the weights and summed up by a weighted addition circuit 608.

Figure 8:
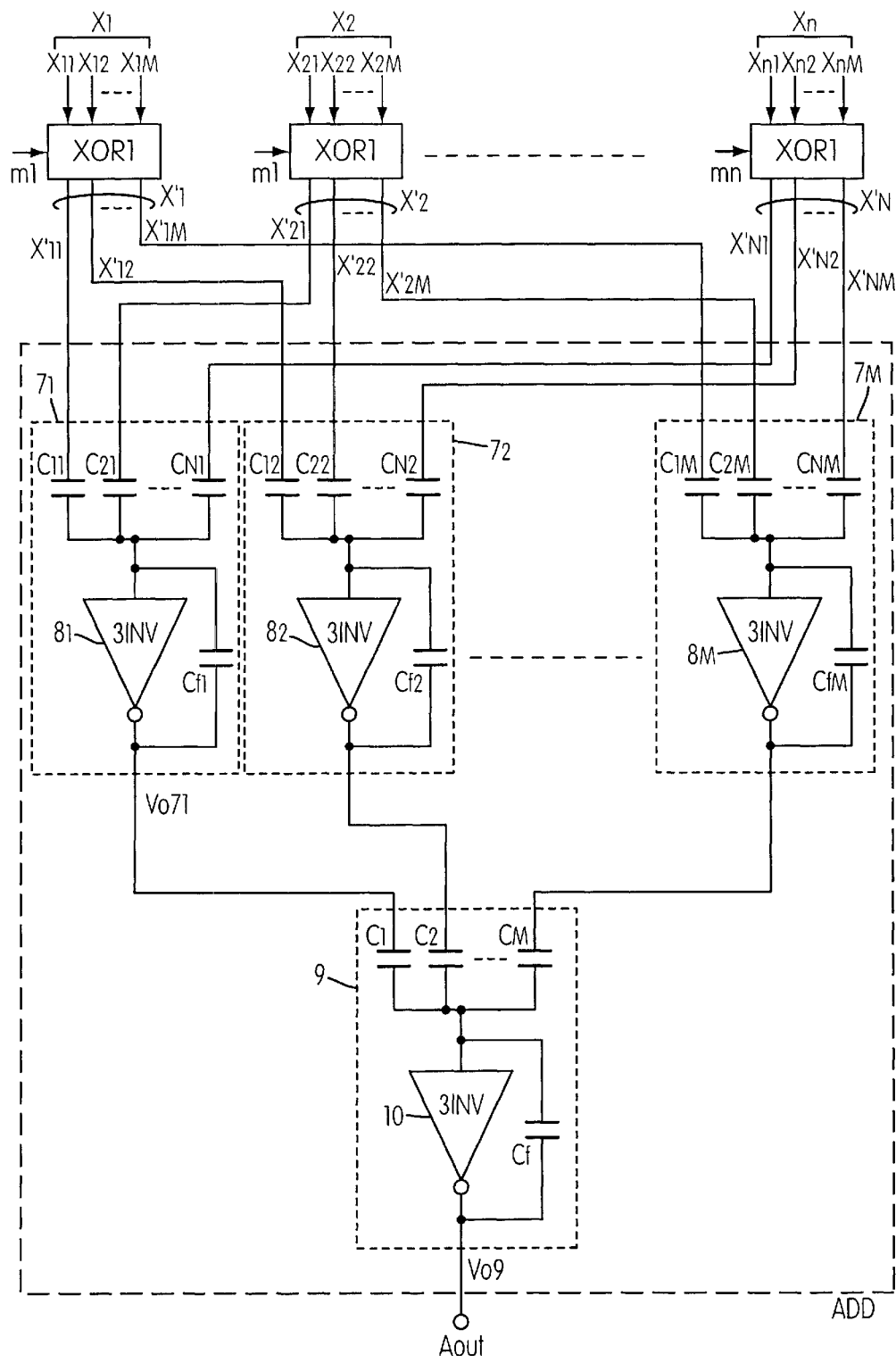
FIG. 8 is a block diagram showing another analog adder.

FIG. 8 is a block diagram showing another adder 802 ADD. This adder 802 directly adds the outputs of the exclusive-OR circuits 602 XOR1 to XORn without the D/A converter 604. The adder 802 ADD includes analog adders from $7_1$ to $7_M$ for receiving the bits from MSB to LSB, and summed up with weighting by a weighted addition circuit 9. An output of the adder 9 is the total summation of the outputs of XOR1 to XORn.

The adder $7_1$ includes a capacitive coupling consisting of parallel capacitances C11 to CN1 outputs of which are commonly connected to an input of an inverting amplifier $8_1$. An output of the inverting amplifier $8_1$ is connected through a feedback capacitance $Cf_1$ to its input for compensating a linearity of the output of the amplifier with respect to its input. Here, inputs to the capacitances $C_{11}$ to $C_{N1}$ are $X'_{11}$ to $X'_{1M}$, $C_{11}=C_{12}=$ . . . $=CN_1=C_{f1/N}$, and an offset voltage of the amplifier is Vb, the output of the adder $7_1$ is defined as in the formula (1).

$$Vo7_1 - Vb = \frac{\sum_{i=1}^{N}(X'i1 - Vb) \cdot Ci1}{Cf1} = \frac{\sum_{i=1}^{N} X'i1}{N} + Vb \qquad (1)$$

The adder $7_2$ to $7_m$ are similar to $7_1$, so the descriptions therefor are omitted.

The weighted addition circuit 9 includes a capacitive coupling consisting of parallel capacitances $C_1$ to $C_M$, corresponding to the adders $7_1$ to $7_M$, outputs of which are commonly connected to an input of an inverting amplifier 10. An output of the inverting amplifier 10 is connected through a feedback capacitance $C_f$ to its input for compensating a linearity of the output of the amplifier with respect to its input. Here, the capacitances $C_1$ to $C_M$ have capacities proportional to the weights of MSB to LSB of the A/D converter, that is, $2^{m-1}, 2^{m-2}, \ldots, 2^2, 2^1, 2^0$. A relationship between $C_f$ and $C_1$ to $C_M$ is as in the formula (2). The output voltage Vo9 of the inverting amplifier 10 is defined as in the formula (3). Here, the input voltages to $C_1$ to $C_M$ are $V_1$ to $V_M$.

$$Cf = \sum_{i=1}^{N} Ci \qquad (2)$$

$$Vo9 - Vb = -\frac{\sum_{i=1}^{N}(Vi - Vb) \cdot Ci}{Cf} = -\sum_{i=1}^{M} 2^{i-1} \cdot Vi + Vb \qquad (3)$$

Figure 9:
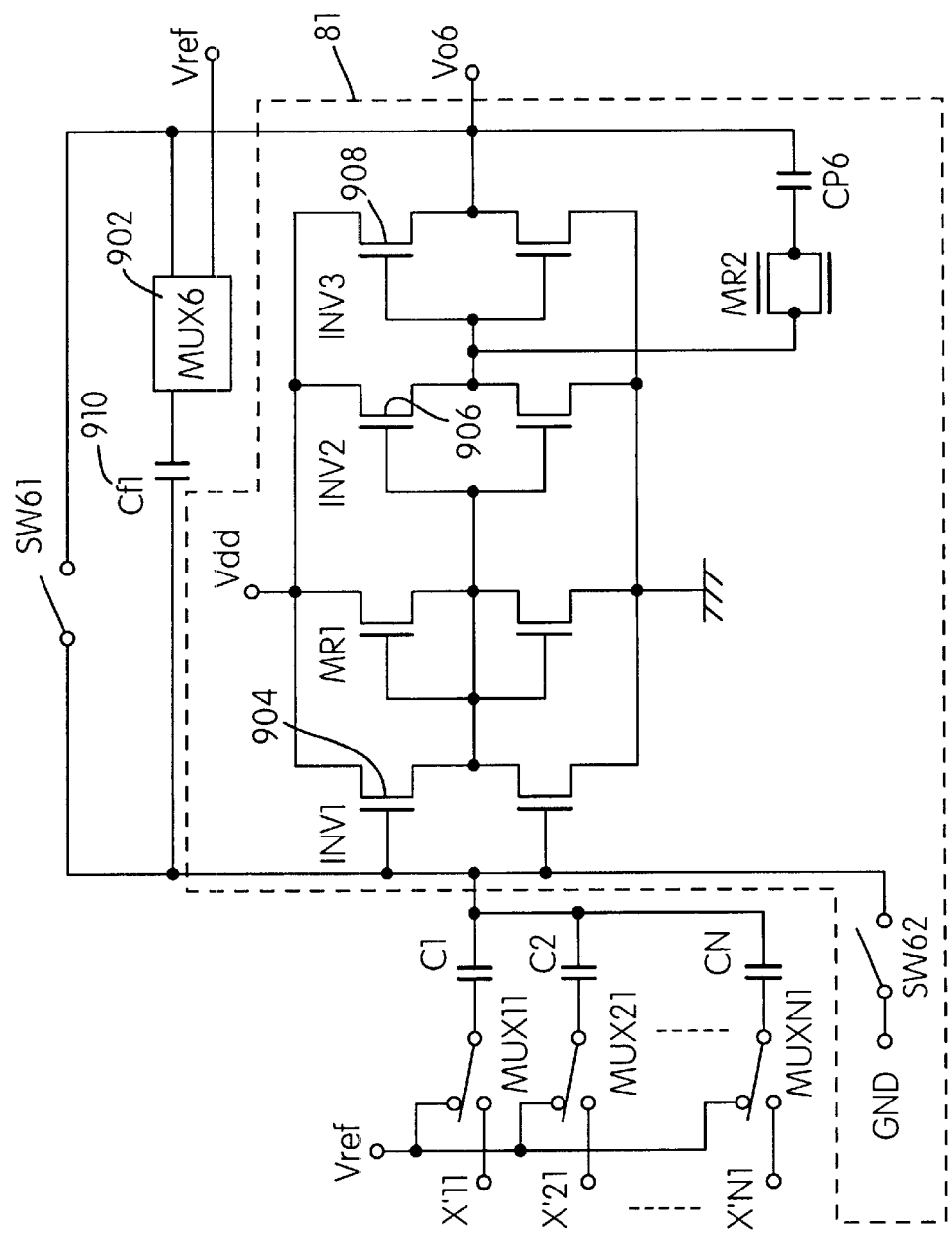
FIG. 9 is a block diagram showing an inverting amplifier in FIG. 8.

FIG. 9 is a block diagram showing the inverting amplifier $8_1$ together with capacitances $C_f$ and $C_{11}$ to $C_{N1}$. The inverting amplifier $8_1$ includes three stages CMOS inverters INV1 904, INV2 906 and INV3 908 serially connected. A multiplexer MUX 6902 is connected between the output of the amplifier and the feedback capacitance Cf 910, for connecting the $Cf_1$ output alternatively to the amplifier output or a reference voltage Vref. The input of the amplifier is connectable through a switch SW62, and $Cf_1$ can be short-circuited by a switch SW61. By connecting MUX 6902 to Vref and by closing SW61, the electric load of Cf is canceled for refreshing.

By connecting a gate input of INV1 904 to a ground and by opening SW62, the CMOS inverters enter a sleep mode to prevent electrical power consumption. Multiplexers MUX11 to MUXN1 are connected to inputs of the capacitances $C_{11}$ to $C_{N1}$, for alternatively connecting $C_1$ to $C_N$ to $X'_{11}$ to $X'_{N1}$ or to Vref. When refreshed, $C_1$ to $C_N$ are connected to Vref.

A MOS resistance URI is connected to the first and second stages of the CMOS inverters in the inverting amplifier $8_1$, for reducing the total gain of the amplifier. A serial circuit of a MOS resistance NM and a capacitance CP6 is connected between the input and output of the last stage CMOS inverter for phase compensation. Unstable oscillation and unexpectedly large amplitude of the output is prevented.

As mentioned above, since it is possible to make the inverting amplifier $8_1$ enter a sleep mode by the switch SW62, the electrical power consumption is reduced at times other than the correlation peaks by opening the switch SW62.

The calculation registers CAL-REG1 302 and CAL-REG2 304 continuously shift and circulate the data even when the inverting amplifier $8_1$ is in a sleep mode for preventing the power consumption of the adder ADD. If the shifting and circulating are adjusted only for the correlation peaks, the continuous circulation is unnecessary. Then, the power consumption is decreased. In this case, zigzag type shift register is necessary for shifting the data to any stages in one clock.

Figure 10:
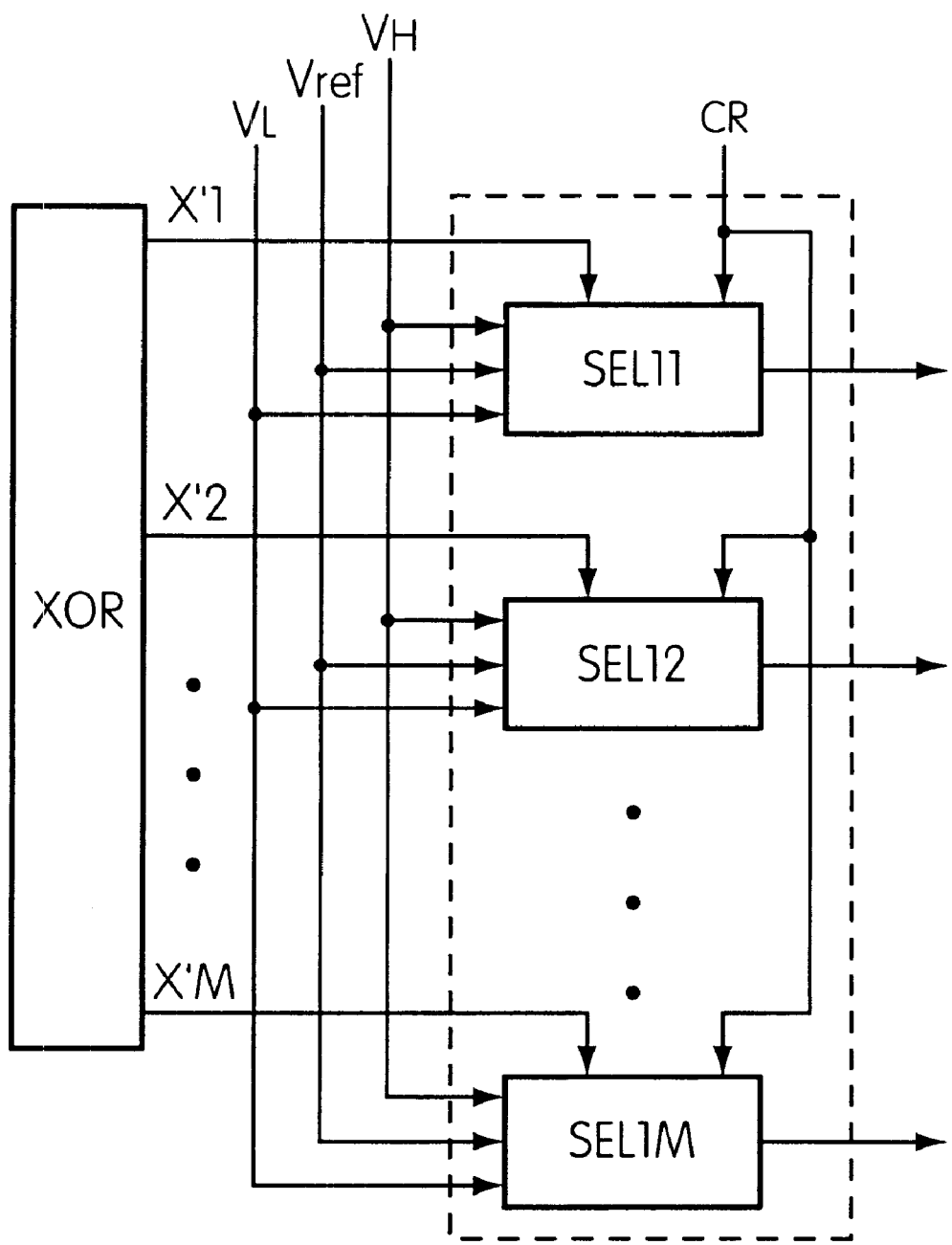
FIG. 10 is a block diagram showing an exclusive-OR circuit.

In FIG. 8, the outputs of XOR1 to XORn are directly input to the adder, however, it is better to use high level supply voltage VH or low level supply voltage VL supplied from the outside, as shown in FIG. 10.

As shown in FIG. 10, selectors 212 SEL11 to SEL 1 M are connected to output of the exclusive-OR circuits X'1 to X'M, output of which are connected to capacitances at the input side of the analog adders. The voltages $V_H$ and $V_L$, and reference voltage Vref are supplied to the selectors SEL11 to SEL1M which are controlled by the output-bit of XOR and a refresh control signal CR. When the output-bit is high level, the high level voltage $V_H$ is output, and when the output-bit is low level, the low level voltage $V_L$ is output. When CR is high level, the reference voltage Vref is output. In this circuit, voltages without noise are supplied to the analog adder, and the calculation accuracy is improved.

Figures 11, 12:
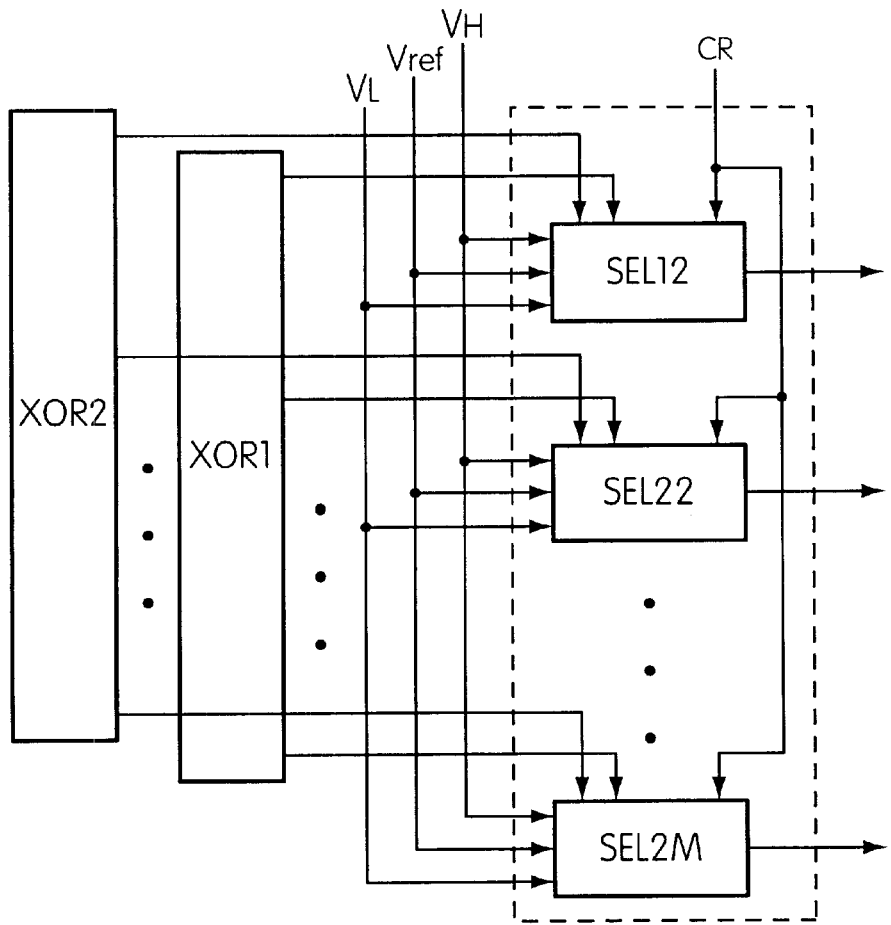
FIG. 11 is a block diagram showing another exclusive-OR circuit.
FIG. 12 is a truth table of selectors in FIG. 11.

FIG. 11 is a block diagram showing further another exclusive-OR circuit for diminishing the circuit size. In this embodiment, each selector outputs 4 levels of voltage output in response to outputs of two exclusive-OR circuits 214 XOR1 and XOR2. The number of inputs to the analog adder is a half of that of the embodiment of FIG. 10. The corresponding bits of the outputs X1 and X2 of the exclusive-OR circuits XOR1 and XOR2, and the refresh signal CR are input to the selectors SEL21 to SEL2M as the control signals. The selectors SEL21 to SEL2M output the voltages $V_H$ and $V_L$ according to the truth table in FIG. 12. When the refresh control CR is high level, the reference voltage Vref is output regardless of the outputs from XOR1 and XOR2.

Since each of the selectors SEL21 to SEL2M outputs one voltage in response to two outputs from XOR1 and XOR2, the number of inputs to the analog adder is decreased to a half.

Figure 13:
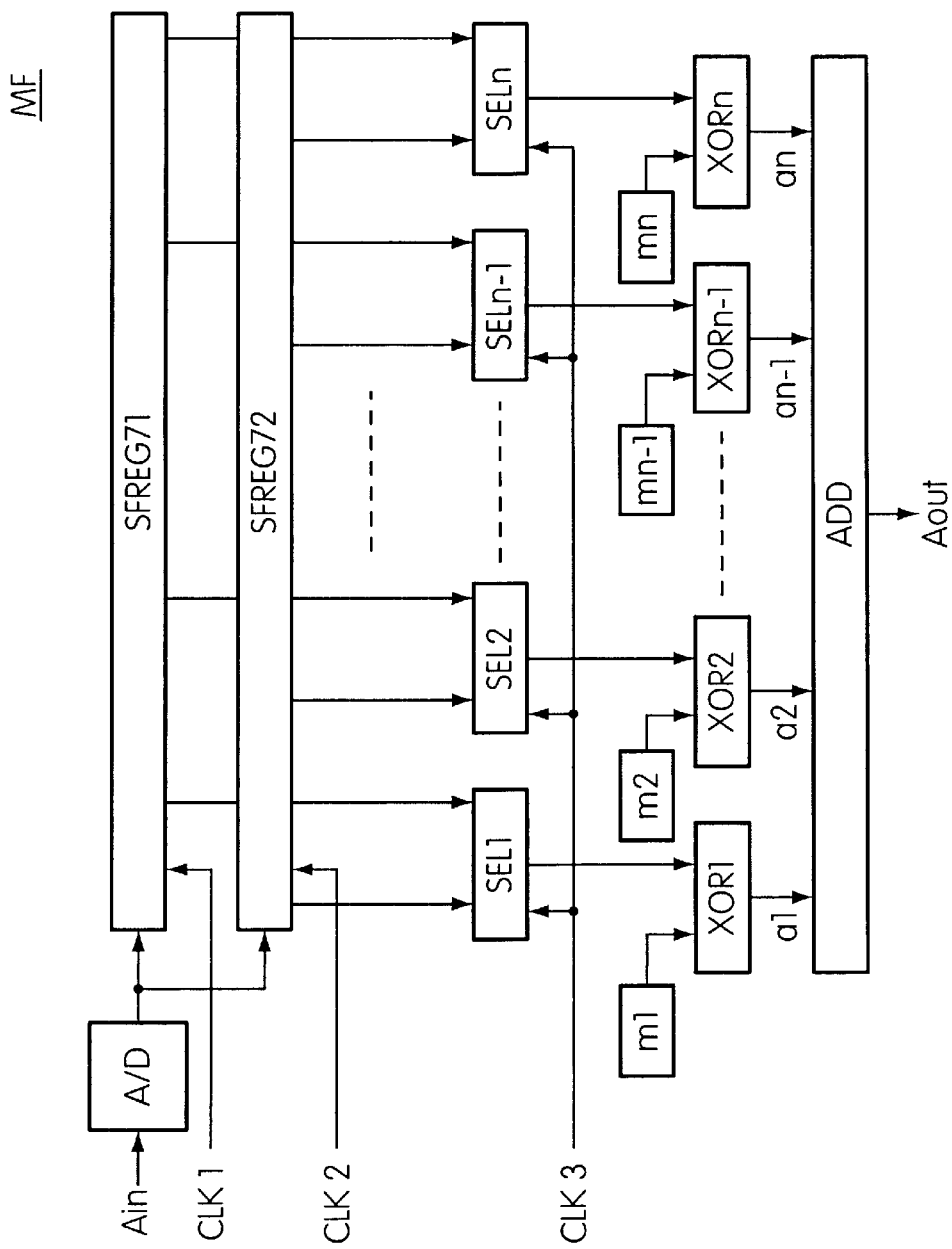
FIG. 13 is a block diagram showing a second embodiment of a matched filter according to the present invention.

FIG. 13 is a block diagram showing a second embodiment of a matched filter according to the present invention. Instead of the circulating input of the input signals to the data register in FIG. 2, the input signals are successively input to shift registers SFREG71 and SFREG72 which shift the signals toward the trailing ends. The spreading codes, for example, $m_1$ to $m_n$ can be fixed with respect to the stages of the shift registers. Outputs of the shift registers are input to selectors SEL1 to SELn to which exclusive-OR circuits XOR1 to XORn, and an adder ADD follow, similarly to the embodiments above.

Figure 14:
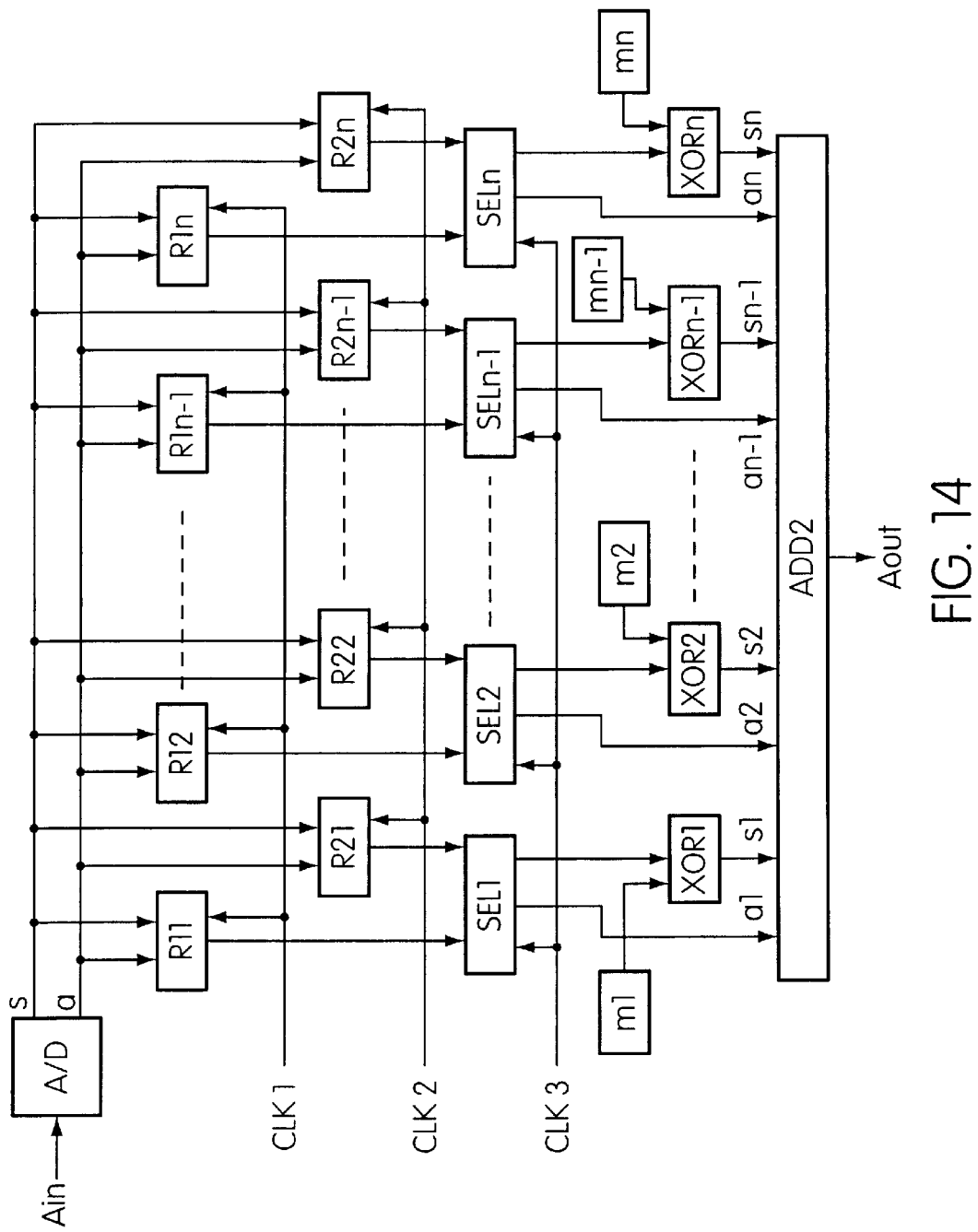
FIG. 14 is a block diagram showing a third embodiment of a matched filter according to the present invention.

FIG. 14 is a block diagram showing a third embodiment of a matched filter in which the outputs from the A/D converter are signed digital data. Digital data "a" is indicative of an absolute value and bit "s" is output from the A/D converter. The data "a" and "s" are input in parallel to series of registers R11 to R1n, or R21 to R2n, and one of the series is selected by the selectors SEL1 to SELn. Multiplier supplying means such as sign bits $m_1$ to $m_n$ are input to the exclusive-OR circuits XOR1 to XORn, and $a_1$ to $a_n$ are input directly to the adder ADD2.

Figure 15:
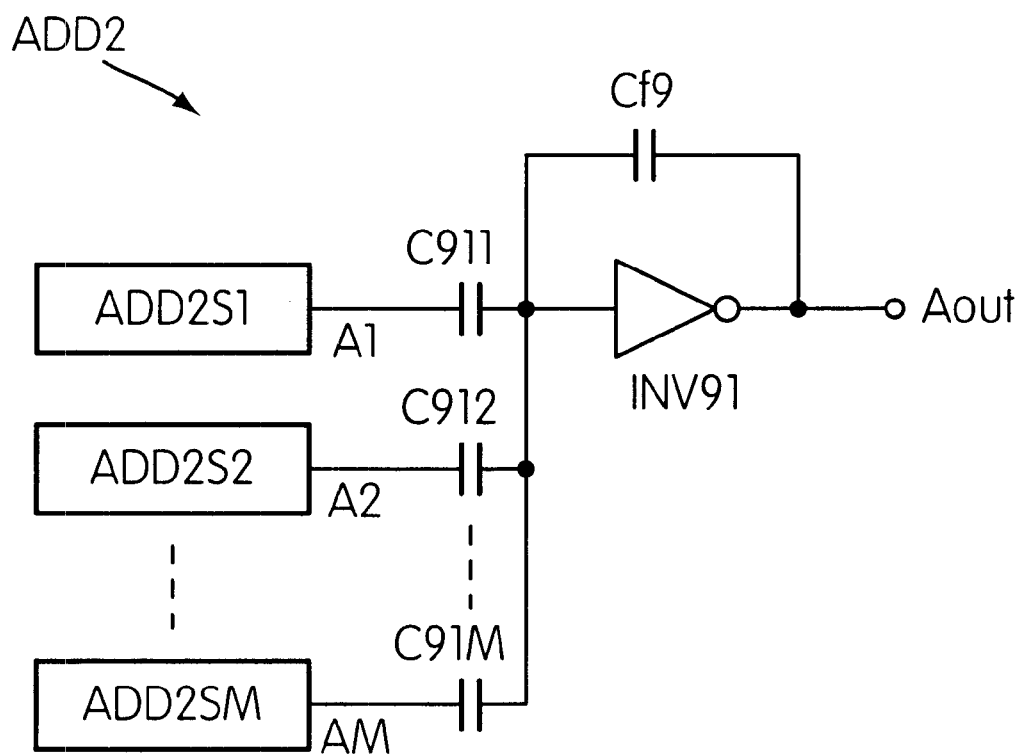
FIG. 15 is a block diagram showing an analog adder in FIG. 14.

FIG. 15 is a block diagram showing an adder ADD2 in FIG. 14. The adder ADD2 includes a plurality of sub-adders ADD2S1 to ADDS2SM corresponding to absolute bits of the A/D converter. The outputs of the sub-adders are input to an summation circuit which includes a capacitive coupling having a plurality of capacitances C911 to C91M, an inverting amplifier INV91 connected at its input to outputs of the capacitive coupling, and a feedback capacitance $Cf_9$ connected between an input and output of the inverting amplifier INV91. The summation circuit weights the outputs of the sub-adders with weights corresponding to the bit weights and sums them up. The capacitances C911 to C91M have capacities proportional to $2_{m-1}, 2^{m-2}, \ldots, 2^2, 2^1, 2^0$, a relationship between Cf9 and C911 to C91M is as in the formula (4). An output Aout of ADD2 is expressed by the formula (5).

$$Cf9 = \sum_{i=1}^{M} C91i \qquad (4)$$

$$Aout - Vb = -\frac{\sum_{i=1}^{M} C91i \cdot (Ai - Vb)}{Cf9} = -\sum_{i=1}^{M} 2^{i-1} \cdot Ai + Vb \qquad (5)$$

Figure 16:
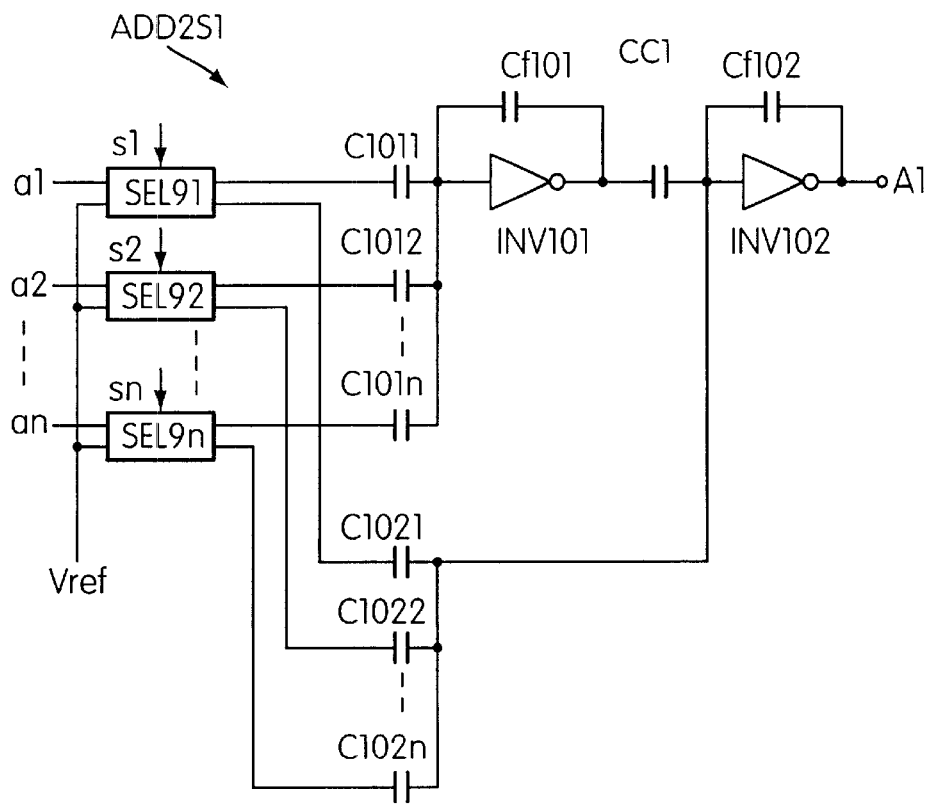
FIG. 16 is a block diagram showing a sub-adder in FIG. 15.

FIG. 16 is a block diagram showing a sub-adder ADD2S1 in FIG. 14. The sub-adder ADD2S1 includes selectors SEL91 to SEL9n to which exclusive-ORs of the sign bits and the multipliers are input as control signals. The reference voltage Vref and the absolute value data $a_1$ to $a_n$ are input to the selectors SEL91 to SEL9n. The selectors SEL91 to SEL9n introduce $a_1$ to $a_n$ to one of capacitive couplings, having capacitances C1011 to C101n or C1021 to C102n. An output of the capacitive coupling (C1011 to C101n) is connected to an input of an inverting amplifier INV101, output of which is connected to its input through a feedback capacitance Cf101. An output of the inverting amplifier INV101 is connected through a capacitance CC1 to an input of the inverting amplifier INV102, and an output of the capacitive coupling (C1021 to C102n) is directly connected to the input of the inverting amplifier INV102. An output of INV102 is connected to its input through a feedback capacitance Cf102. ADD2S2 to ADD2SM are similar to ADD2S1, so descriptions therefor are omitted.

When the exclusive-OR calculation is "0" (positive), the selectors introduce the inputs to the capacitive coupling (C1011) to C101n), and when "1" (negative), to the capacitive coupling (C1021 to C102). The sub-adders simply add the output bits, and execute the addition and subtraction shown by A1 in the formula (6). Here, C1011=C1012= . . . =C101n=C1021= . . . =C1022= . . . =C102N=CC1/n=Cf101/n=Cf102/n, and the formulae (7) and (8) are given.

$$A1 - Vb = \frac{CC1}{Cf101 \cdot Cf102} \sum_{i=1}^{n} \{(\overline{Si} \cdot ai + si \cdot Vref)) - Vb\} \cdot \quad (6)$$

$$C101i \frac{1}{Cf102} \sum_{i=1}^{n} \{(si \cdot ai + \overline{si} \cdot Vref) - Vb\} \cdot C102i$$

$$= \frac{1}{n} \sum_{i=1}^{n} \{(\overline{si} - si)(ai - Vref)\}$$

$$Cf101 = \sum_{i=1}^{n} C101i \quad (7)$$

$$CC1 = Cf102 = \sum_{i=1}^{n} C102i \quad (8)$$

Instead of the circuits for summing up the total bits of the same weight with respect to each weight as shown in FIGS 6, 7 and 13, a circuit can be used, in which outputs X'11 to X'1M from the exclusive-OR circuits XOR1 (FIG. B) are weighted, and similar calculations are performed for XOR2 to XORn, and the weighted addition results are summed. This circuit is larger in circuit size due to increased weighted addition circuits and increased unit capacitances.

Figure 17:
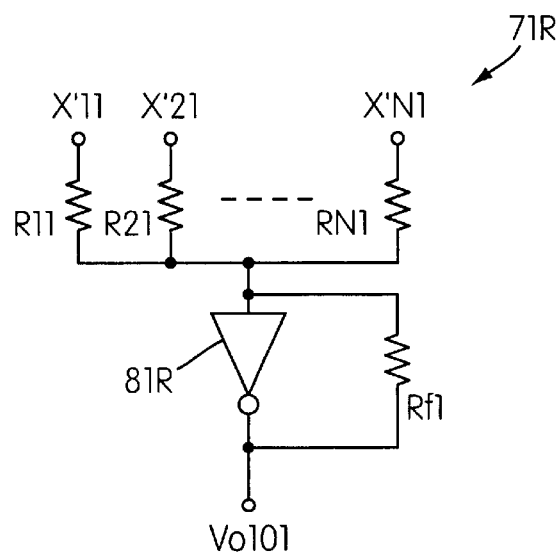
FIG. 17 is a circuit diagram showing another analog adder for the third embodiment.

FIG. 17 is a circuit diagram showing an adder for the third embodiment. The adder includes an adder 71R corresponding to the adder 71. The adder 71R includes a resistance coupling consisting of parallel resistances R11 to RN1 corresponding to $C_{11}$ to $C_{N1}$ outputs of which are commonly connected to an input of an inverting amplifier 81R. An output of the inverting amplifier 81R is connected through a feedback resistance Rf1 to its input. Here, inputs to the resistances R11 to RN1 are X'11 to X'N1, N·Rf1=R11= R21= . . . =RN1, the output is defined as in the formula (9).

$$Vo101 - Vb = -\frac{\sum_{i=1}^{N} \frac{(X'i1 - Vb)}{Ri1}}{\frac{1}{Rf1}} = -\frac{\sum_{i=1}^{N} X'i1}{N} + Vb \quad (9)$$

A simple addition is performed.

Figure 18:
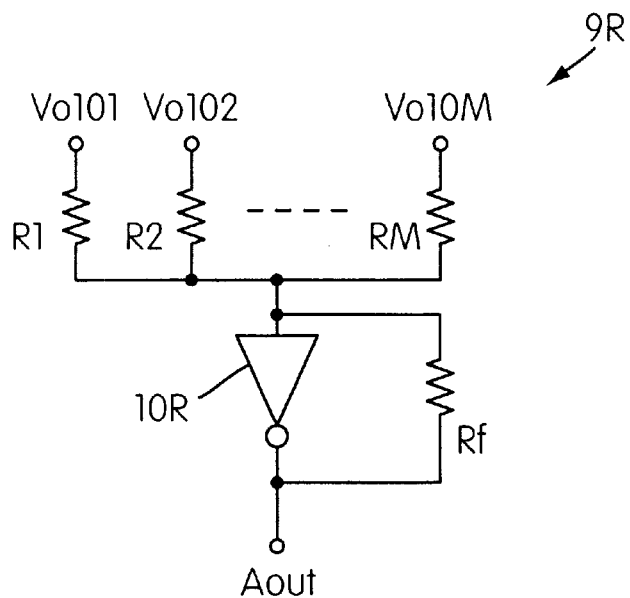
FIG. 18 is a circuit diagram showing an analog adder used together with the adder in FIG. 17.

FIG. 18 is a circuit diagram showing an adder using weighted addition circuit 9R similar to the weighted addition circuit in FIG. 8. The weighted addition circuit 9R includes a resistance coupling consisting of resistances R1 to RM corresponding to C1 to CM. An output of the resistance coupling is connected through a feedback resistance Rf to its input.

When inputs of the resistances R1 to RM are Vo101 to Vo10M, a relationship between MRf and R1 to RM is as in the formula (10). An output Aout is expressed as in the formula (11).

$$Rf = RM = 2^{-1}RM - 1 = 2^{-2}RM - 21 = \ldots = 2^{-(M-1)}R1 \quad (10)$$

$$Aout - Vb = -\frac{\sum_{i=1}^{M} \frac{(X'i1 - Vb)}{Ri1}}{\frac{1}{Rf1}} = -\sum_{i=1}^{M} 2^{i-1} \cdot Vo10i + + Vb \quad (11)$$

Figure 19:
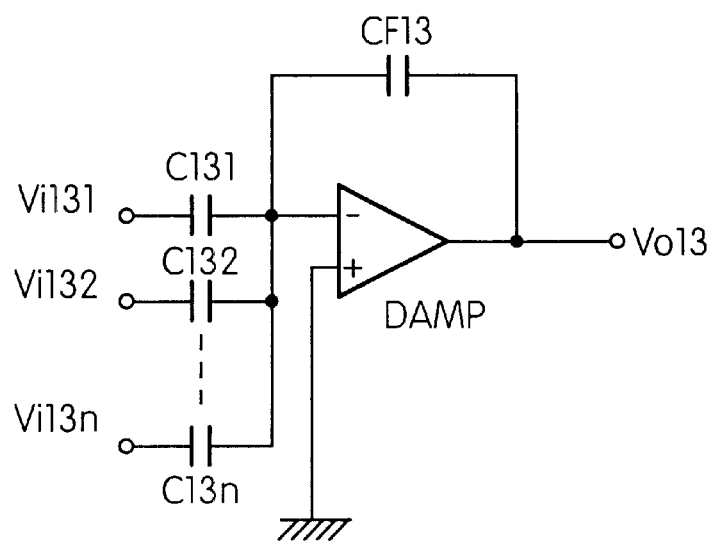
FIG. 19 is a circuit diagram showing another analog adder used together with the adder in FIG. 17.

FIG. 19 is a circuit diagram showing an adder using a MOS differential amplifier DAMP instead of the CMOS inverter-inverting amplifier. An output of DAMP is input to an inverted input, and noninverted input is grounded. An output of DAMP is connected through a feedback capacitance CF13 to its input.

Figure 20:
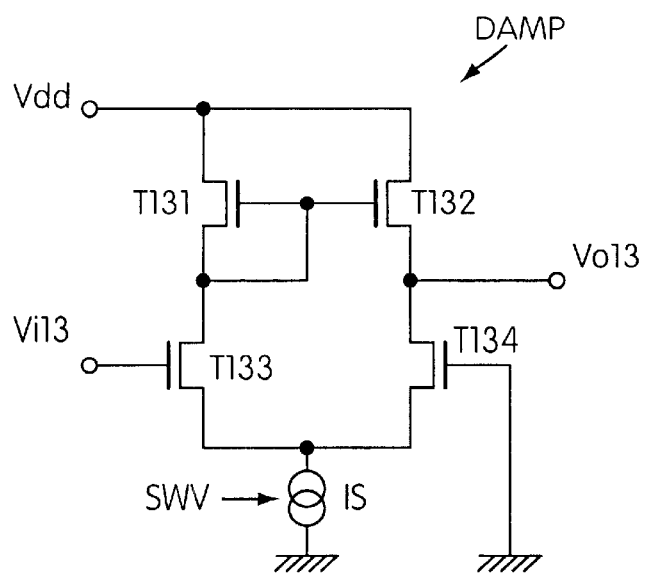
FIG. 20 is a circuit diagram showing a MOS differential amplifier in the analog adder in FIG. 19.

FIG. 20 is a circuit diagram showing the MOS differential amplifier DAMP in FIG. 19. The MOS differential amplifier includes two symmetric pairs of MOS transistors T131 and T133, and T132 and T134. The transistors T131 and T132 are connected at their gates with each other, and their gates are connected to a drain of the transistor T133. An input signal is input to a gate of the transistor T133, and a gate of the transistor T134 is grounded. A drain of T134 is connected to an output terminal. A constant current source IS is disposed, to which a control signal SWV is input. The DAMP enters a sleep mode with IS is cut off by the control signal so that the electrical power consumption is stopped.

Figure 21:
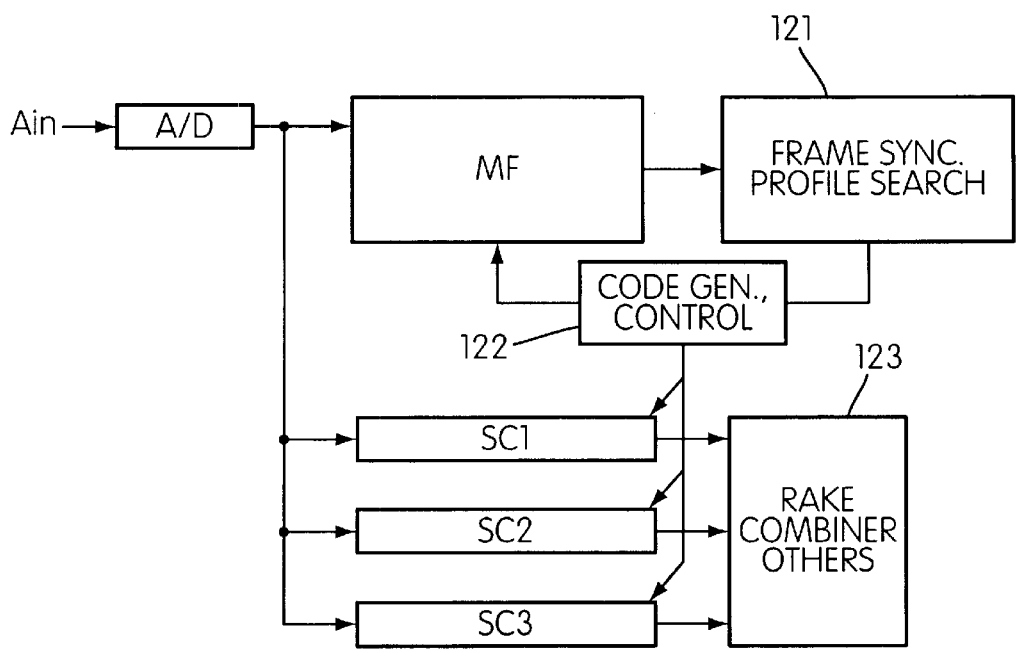
FIG. 21 is a block diagram showing another embodiment of a signal reception apparatus for DS-CDMA cellular system.

In FIG. 21, an analog input signal Ain is passed through an A/D converter 2102 and is input to a matched filter 2104 as well as to sliding correlators SC1 2106, SC2 2108 and SC3 2110. The matched filter 2104 is used for an initial acquisition of the input signal Ain, and after completing of the initial acquisition, demodulation is performed by the sliding correlators. The electric power consumption of the matched filter 2104 is reduced. The matched filter 2104 is intermittently used for tracking after the initial acquisition, or a delay-locked-loop (DLL) is used for the tracking. The power consumption can be decreased by DLL, however, the additional DLL makes the circuit size bigger. An output of the matched filter is input to a circuit 121 for frame synchronization during the initial acquisition. The circuit 121 outputs a signal to a circuit 122 for a code generation and a control which determines the synchronization timing of the sliding correlators SC1 2106, SC2 2108 and SC3 2110. Output of the sliding correlators SC1 2106 to SC3 2110 are input to a circuit 123 for various processing such as rake combining. Since the sliding correlators are usually digital circuits, digital input to the matched filter 2104 is preferable for the sliding correlators.

What is claimed is:

1. A matched filter for calculating a correlation between successive analog input signals and a spreading code consisting of a series of 1 bit data, comprising:

an analog to digital (A/D) converter for converting the analog input signals to digital data;

a plurality of data holding means each having a plurality of stages for holding said digital data in said plurality of stages;

a multiplier supplying means for supplying the spreading code;

a plurality of exclusive-OR circuits corresponding to said plurality of stages, each of which performs an exclusive-OR calculation of one of said digital data input and one of the series of 1 bit data;

an adder for summing said exclusive-ORs calculations, wherein said A/D converter receives said analog input signals in response to a sampling clock of a multiple sampling rate corresponding to a number of said plurality of data holding means, wherein each said plurality of data holding means is successively selected to output said analog input signals to said plurality of exclusive-OR circuits; and said adder successively sums said exclusive-OR calculations corresponding to said plurality of data holding means selected.

2. The matched filter as claimed in claim 1, wherein, each of said plurality of data holding means is a plurality of data registers which receive said digital data successively and circulatedly in synchronism with said sampling clock, said plurality of data holding means are connected in parallel to said A/D converter, and one of said plurality of data holding means is successively selected for receiving said digital data synchronously to said sampling clock, and each of said multiplier supplying means is a shift register which shifts and circulates said spreading code synchronously to said sampling clock so that a relationship between an order of said digital data and an order of said spreading code is maintained.

3. A matched filter as claimed in claim 2, wherein one or more of said multiplier holding means outputs said spreading code shifted by one stage from said order for maintaining said relationship.

4. A matched filter as claimed in claim 2, wherein each said exclusive-OR circuit outputs high level or low level voltage supplied from outside according to said exclusive-OR of said digital data and said spreading code.

5. A matched filter as claimed in claim 2, wherein said analog adder comprises a plurality of analog sub-adders each of which corresponding to one of weights of bits of said outputs from said exclusive-OR circuits, and each said sub-adder sums said bits of said corresponding weight up, and said analog adder further comprises a weighted adder for weighting said outputs of said sub-adders and for summing them up.

6. A matched filter as claimed in claim 2, wherein said analog adder comprises a plurality of weighted adders for weighting said outputs of said exclusive-OR circuits and summing them up, and an adder for summing outputs of said weighted adders.

7. A matched filter as claimed in claim 2, wherein said analog adder comprises a capacitive coupling including a plurality of capacitances inputs thereof are connected input voltages, an inverting amplifier input of which is commonly connected to outputs of said capacitances, and a feedback capacitance connected between an output and said input of said inverting amplifier, whereby said weighting addition and said summation are performed.

8. A matched filter as claimed in claim 2, wherein said analog adder comprises a resistance coupling including a plurality of resistances inputs thereof are connected input voltages, an inverting amplifier input of which is commonly connected to outputs of said resistances, and a feedback resistance connected between an output and said input of said inverting amplifier, whereby said weighting addition and said summation are performed.

9. A matched filter as claimed in claims 7, wherein said inverting amplifier comprises a plurality of serially connected CMOS inverters.

10. A matched filter as claimed in claims 7, wherein said inverting amplifier comprises a MOS differential amplifier.

11. A matched filter as claimed in claims 7, wherein said inverting amplifier enters a sleep mode by a control from outside.

12. A matched filter according to claim 8, wherein said inverting amplifier comprises a plurality of serially connected CMOS inverters.

13. The matched filter according to claim 8, wherein said inverting amplifier comprises a MOS differential amplifier.

14. The matched filter according to claim 8, wherein said inverting amplifier enters a sleep mode via an outside control.

15. The matched filter as claimed in claim 1, wherein, each of said plurality of data holding means is a shift register which receives and shifts said digital data synchronously to said sampling clock; and said multiplier supplying means comprises a register for holding said spreading code.

16. The matched filter as claimed in claim 1, wherein, said digital data is signed digital data having a sign bit indicative of one of a positive and a negative status of said analog input signals; and a section signal having two status is calculated by an exclusive-OR of said sign bit and said spreading code, said adder subtracts a summation of exclusive-OR calculations corresponding to one of said status of said selection signal from a summation of exclusive-OR calculations corresponding to the other status of said selection signal.

17. A matched filter as claimed in claim 1, wherein said multiplier supplying means comprises a plurality of multiplier holding means which hold different spreading codes, one of which is selected for supplying said spreading code to said exclusive-OR circuits.

18. A matched filter as claimed in claim 17, wherein said plurality of multiplier holding means are selected in a time-sharing manner, and said analog adder calculates a summation in a time-sharing manner synchronously to said selection of said multiplier holding means.

19. A matched filter as claimed in claim 1, wherein each said exclusive-OR circuit outputs a plurality of levels voltages supplied from outside according to a plurality of said exclusive-ORs.

20. A signal reception apparatus of a DS-CDMA communication system using a matched filter for a correlation calculation between successive analog input signals and a spreading code consisting of a series of 1 bit data, said matched filter comprising:

an analog to digital (A/D) converter for converting said analog input signals into digital data;

a plurality of data holding means each having a plurality of stages for holding said digital data in said plurality of stages;

a multiplier supplying means for supplying said spreading code;

a plurality of exclusive-OR circuits corresponding to said plurality of stages, each of which calculates an exclusive-OR of one of said digital data and one of said series of 1 bit data; and an adder for summing said exclusive-ORs.

* * * * *